(12) United States Patent
Ji et al.

(10) Patent No.: US 10,854,558 B2
(45) Date of Patent: Dec. 1, 2020

(54) SEMICONDUCTOR STRUCTURE AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Deng Feng Ji, Shanghai (CN); Jun Yang, Shanghai (CN); Hong Tao Liu, Shanghai (CN); You He Sha, Shanghai (CN); Chen Xiao Wang, Shanghai (CN); Ying Nan Li, Shanghai (CN)

(73) Assignees: Semiconductor Manufacturing International (Beijing) Corporation, Beijing (CN); Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 16/286,205

(22) Filed: Feb. 26, 2019

(65) Prior Publication Data

US 2019/0273048 A1    Sep. 5, 2019

(30) Foreign Application Priority Data

Mar. 2, 2018    (CN) .......................... 2018 1 0175889

(51) Int. Cl.
*H01L 23/528*    (2006.01)
*H01L 21/768*    (2006.01)
*H01L 23/552*    (2006.01)
*H01L 23/522*    (2006.01)

(52) U.S. Cl.
CPC ........ *H01L 23/552* (2013.01); *H01L 21/7684* (2013.01); *H01L 21/76816* (2013.01); *H01L 21/76877* (2013.01); *H01L 23/5226* (2013.01); *H01L 23/5283* (2013.01)

(58) Field of Classification Search
CPC ............... H01L 23/552; H01L 23/5253; H01L 21/76877; H01L 21/76816; H01L 21/7684; H01L 23/5226
USPC ........ 257/659, 758, 762, 774; 438/118, 622, 438/629, 629.626
See application file for complete search history.

(56) References Cited

U.S. PATENT DOCUMENTS

2002/0182857 A1* 12/2002 Liu et al. ............ H01L 21/4763
                                                      438/645
2018/0315620 A1* 11/2018 Lee et al. ................ H01L 21/50

* cited by examiner

*Primary Examiner* — Thinh T Nguyen
(74) *Attorney, Agent, or Firm* — Anova Law Group, PLLC

(57) ABSTRACT

Semiconductor structures and fabrication methods are provided. An exemplary fabrication method includes providing a semiconductor substrate having at least a first region; forming a dielectric structure over the semiconductor substrate; forming a plurality of first openings in the dielectric structure in the first region by removing portions of the dielectric structure in the first region; forming a first barrier member in each of the plurality of first openings; forming second openings with sidewall surfaces exposing sidewall surfaces of the first barrier members by removing portions of the dielectric structure between adjacent first openings; and forming a second barrier member in each of the plurality of second openings.

20 Claims, 5 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 201810175889.5, filed on Mar. 2, 2018, the entirety of which is incorporated herein by reference.

FIELD OF THE DISCLOSURE

The present disclosure generally relates to the field of semiconductor manufacturing and, more particularly, relates to semiconductor structures and fabrication methods.

BACKGROUND

Semiconductor devices are formed by high-level integrated electronic devices, such as transistors and/or capacitors on a semiconductor substrate, such as silicon substrate, using deposition processes, photolithography processes and etching processes. The deposition processes, photolithography processes and etching processes are repeated for certain times to form patterns with certain shapes. When the patterns are formed repeatedly in a layered structure, the height difference becomes severe on the top of the formed structure. The severe height difference on the top of the formed structure causes an off-focus issue of the mask patterns in the subsequent photolithography process. Thus, it is difficult to form micro-patterns.

One approach to reduce the height difference of the base substrate is to use a chemical mechanical polishing (CMP) process. The CMP process includes polishing the base substrate having the height difference in a mechanical way and a chemical way to planarize the top surface of the base substrate.

However, when the CMP process is used to planarize the material in a large size trench, the performance of the material in the large size trench may not be as desired. The disclosed methods and structures are directed to solve one or more problems set forth above and other problems in the art.

BRIEF SUMMARY OF THE DISCLOSURE

One aspect of the present disclosure includes a method for fabricating a semiconductor structure. The method includes providing a semiconductor substrate having at least a first region; forming a dielectric structure over the semiconductor substrate; forming a plurality of first openings in the dielectric structure in the first region by removing portions of the dielectric structure in the first region; forming a first barrier member in each of the plurality of first openings; forming second openings with sidewall surfaces exposing sidewall surfaces of the first barrier members by removing portions of the dielectric structure among adjacent first openings; and forming a second barrier member in each of the second openings.

Another aspect of the present disclosure includes a semiconductor structure. The semiconductor structure includes a semiconductor substrate having a dielectric structure and having at least a first region; a plurality of first openings formed in the dielectric structure in the first region; a first barrier member formed in each of the plurality of first openings; a plurality of second openings formed between adjacent first barrier members and with sidewall surfaces exposing sidewall surfaces of the first barrier members; and a second barrier member formed in each of the plurality of second openings.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
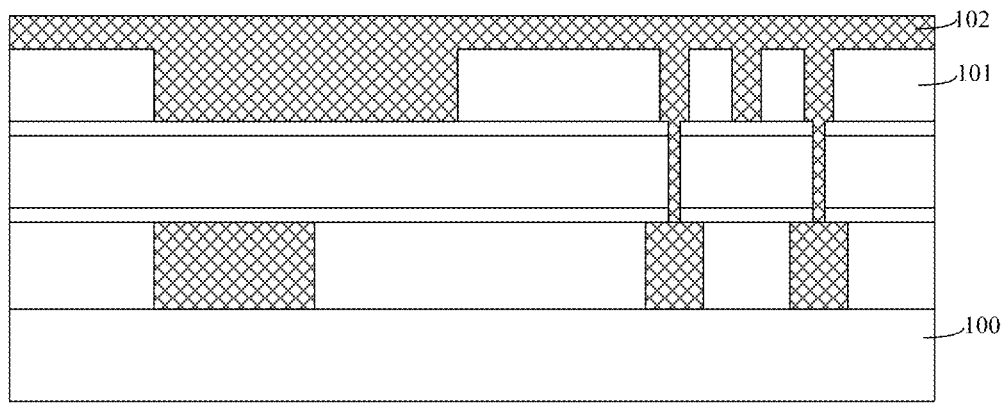
FIGS. 1-2 illustrate structures corresponding to certain stages during a fabrication process of a semiconductor structure.
Figure 2:
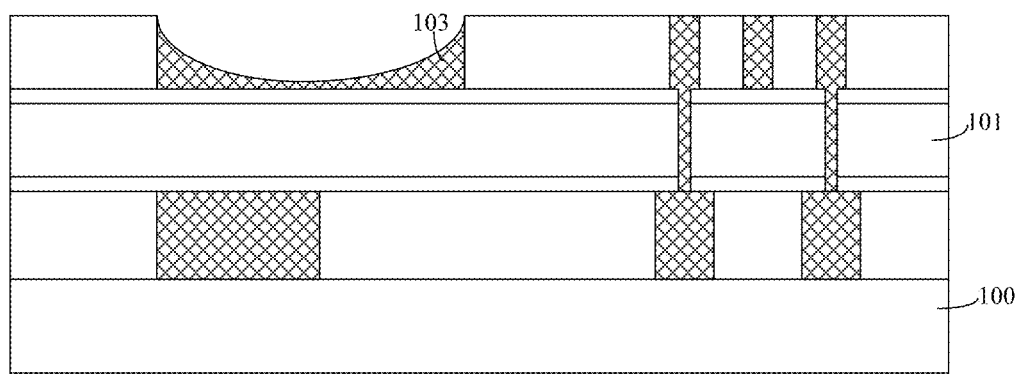

FIGS. 1-2 illustrate structures corresponding to certain stages during a fabrication process of a semiconductor structure. As shown in FIG. 1, the fabrication process includes providing a semiconductor substrate 100. A dielectric structure 101 is formed on the semiconductor substrate 100. The dielectric structure 101 may have an opening (not labeled). Further, a barrier material film 102 is formed in the opening and on the surface of the dielectric structure 101. The barrier material film 102 fills the opening in the dielectric structure 101.

Further, as shown in FIG. 2, the barrier material film 102 is planarized until the top surface of the dielectric structure 101 is exposed. After the planarization process, a barrier layer structure 103 is formed in the opening.

The semiconductor structure includes a radio frequency (RF) circuit. In the RF circuit product, the size of the opening is often substantially large. For example, the size of the opening along the direction parallel to the surface of the semiconductor substrate 100 is greater than 200 µm. The opening is used to accommodate the barrier structure 103. The barrier structure 103 is made of a metal material. The barrier structure 103 is used to reduce the electromagnetic wave loss; and improve the performance of the semiconductor device.

The process for planarizing the barrier material film 102 includes a CMP process. The apparatus of the CMP process includes a polishing pad. During the planarization process, the polishing pad polishes the barrier material film 102. Because the size of the opening along the direction parallel to the surface of the semiconductor substrate 100 is substantially large, and the polishing pad is deformed during the planarization process, the polishing pad is able to enter the opening to polish the barrier material film 102. Thus, after the planarization process, the left-over barrier material film 102 in the opening is substantially small. In particular, the barrier structure 103 in the opening is substantially small. Thus, as shown in FIG. 2, the barrier structure 103 is concave-shaped. Accordingly, the barrier performance of the barrier structure 103 is not as desired. Thus, the electromagnetic wave loss of the semiconductor structure is substantially large; and it does not facilitate to improve the performance of the semiconductor structure.

The present disclosure provides a semiconductor structure and a method for forming a semiconductor structure. The method may include removing portions of the dielectric structure in the first region to form a plurality of discrete first openings in the dielectric structure in the first region. The method may also include forming a first barrier member in each of the plurality of first openings; and removing the portions of the dielectric structure among adjacent first openings to form second openings. The sidewall surfaces of the second openings may expose the sidewall surfaces of the first barrier members. Further, the method may include forming a second barrier member in each of the second openings. The first barrier members and the second barrier members may be together configured as a barrier structure of the semiconductor structure; and the barrier structure may have a desired barrier performance.

Figure 11:
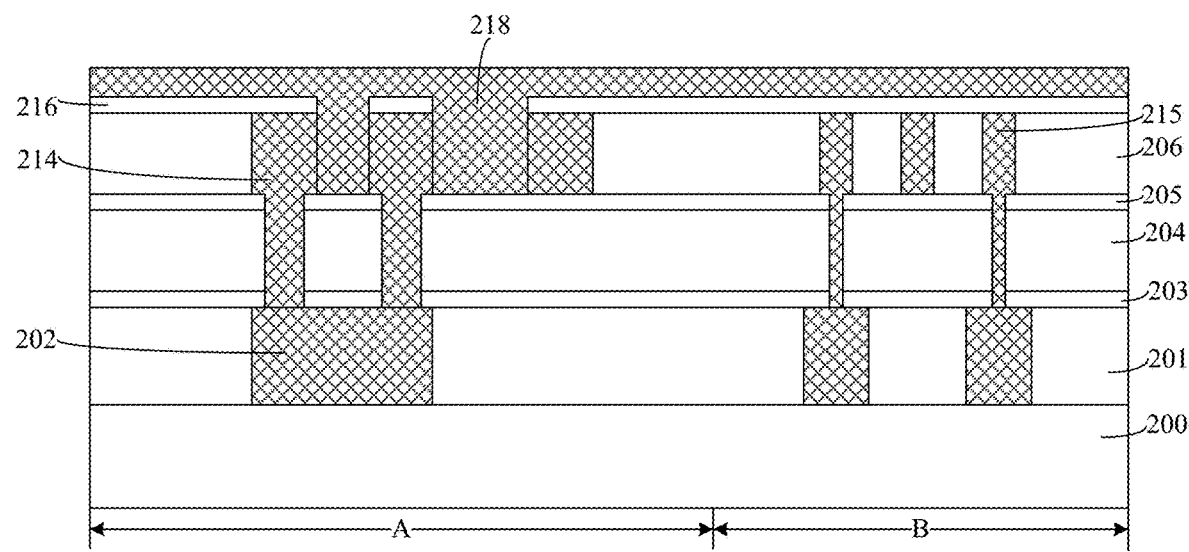
Figure 12:
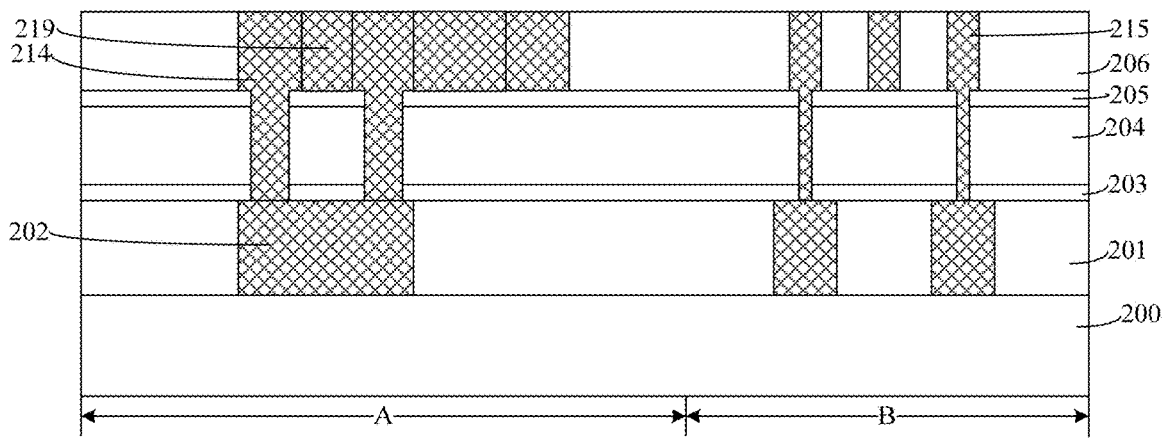
Figure 13:
FIG. 13 illustrates an exemplary fabrication process of a semiconductor structure consistent with various disclosed embodiments.

FIG. 13 illustrates an exemplary fabrication process of a semiconductor structure consistent with various disclosed embodiments. FIGS. 3-12 illustrate structures corresponding to certain stages during the exemplary fabrication process.

Figure 3:
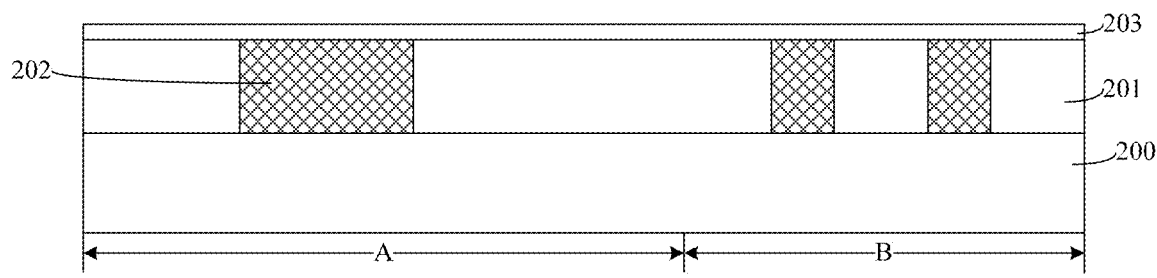
FIGS. 3-12 illustrate structures corresponding to certain stages during an exemplary fabrication process of a semiconductor structure consistent with various disclosed embodiments.

As shown in FIG. 13, at the beginning of the fabrication process, a semiconductor substrate with certain structures is provided (S101). FIG. 3 illustrates a corresponding semiconductor structure.

As shown in FIG. 3, a semiconductor substrate 200 is provided. The semiconductor substrate 200 may include a first region A. In one embodiment, the semiconductor substrate 200 may also include a second region B. An interlayer dielectric layer 201 may be formed on a top surface of the semiconductor substrate 200. An interconnect opening (not labeled) may be formed in the interlayer dielectric layer 201; and a first interconnect structure 202 may be formed in the interconnect opening.

In one embodiment, the semiconductor substrate 200 is made of silicon. In some embodiments, the semiconductor substrate may be a germanium substrate, a silicon germanium substrate, a silicon on insulator (SOI) substrate, a germanium on insulator (GOI) substrate, or a silicon germanium on insulator substrate, etc.

In some embodiments, semiconductor devices, such as MOS transistors, etc., may be formed in the semiconductor substrate 200.

The first region A may be used to subsequently form substantially large size trenches. The second region B may bused to subsequently form a second interconnect structure on the surface of the first interconnect structure and electrically connecting with the first interconnect structure.

The process for forming the interlayer dielectric layer 201 may include forming an interlayer dielectric material layer on the surface of the semiconductor substrate 200; forming an interconnect mask layer on the interlayer dielectric material layer to expose portions of the interlayer dielectric material layer; etching the interlayer dielectric material layer using the interconnect mask layer as an etching mask to form the interlayer dielectric layer 201 with the interconnect opening.

The interlayer dielectric material layer may be made of any appropriate material. In one embodiment, the interlayer dielectric material layer is made of a low-K dielectric material. The low-K dielectric material refers to a dielectric material with a relative dielectric constant smaller than 3.9. The low-K dielectric material may be a porous material. Correspondingly, the interlayer dielectric layer 201 may be made of low-K dielectric material. In some embodiments, the interlayer dielectric material layer may be made of silicon oxide.

In one embodiment, the interlayer dielectric material layer is made of SiCOH. Correspondingly, the interlayer dielectric layer 201 may be made of SiCOH.

In some embodiments, the interlayer dielectric material layer may be made of fluoride-doped silicon oxide (FSG), boron doped silicon dioxide (BSG), phosphor doped silicon dioxide (PSG), or boron and phosphor co-doped silicon dioxide, etc. In other embodiments, the interlayer dielectric material layer may be a multiple-layer structure including a stop layer on the surface of the semiconductor substrate and a low-K dielectric layer on the stop layer.

Correspondingly, the interlayer dielectric layer may be made of fluoride-doped silicon oxide (FSG), boron doped silicon dioxide (BSG), phosphor doped silicon dioxide (PSG), or boron and phosphor co-doped silicon dioxide, etc., or the first dielectric layer may be a multiple-layer structure. In particular, the interlayer dielectric layer may include a stop layer on the surface of the semiconductor substrate; and a low-K dielectric layer on the stop layer.

Various processes may be used to form the interlayer dielectric material layer, such as a chemical vapor deposition (CVD) process, or a physical vapor deposition (PVD) process, etc.

The process for etching the interlayer dielectric material layer using the interconnect mask layer as an etching mask may include a dry etching process, a wet etching process, a combination of a dry etching process and a wet etching process, etc.

The first interconnect structure 202 may be formed in the interconnect opening; and the interlayer dielectric layer 201 may be made of low-K dielectric material. The low-K dielectric material may be able to reduce the capacitance among the first interconnect structure 202; and rescued the signal delay of the circuit.

The process for forming the first interconnect structure 202 may include forming a first interconnect material layer on the top surface of the interlayer dielectric layer 201 and in the interconnect opening; and planarizing the first interconnect material layer until the top surface of the interlayer dielectric layer 201 is exposed. Thus, the first interconnect structure 202 may be formed in the interconnect opening; and the first interconnect structure 202 may fill the interconnect opening.

The first interconnect material layer may be made of a metal material. In one embodiment, the first interconnect material layer is made of Cu. Correspondingly, the first interconnect structure 202 may be made of Cu. In some embodiments, the first interconnect material layer may be made of Al. Correspondingly, the first interconnect structure may be made of Al.

The first interconnect material layer may be formed by any appropriate process, such as a PVD process, or a CVD process, etc. The process for planarizing the first interconnect material layer may include a CMP process, etc.

Optionally and additionally, after forming the first interconnect structure 202, an interconnect stop layer 203 may be formed on the surface of the interlayer dielectric layer 201 and the first interconnect structure 202.

The interconnect stop layer 203 may be made of any appropriate material. In one embodiment, the interconnect stop layer 203 is made of silicon nitride. Various processes may be used to form the interconnect stop layer 203, such as a CVD process, or a PVD process, etc.

Figure 4:
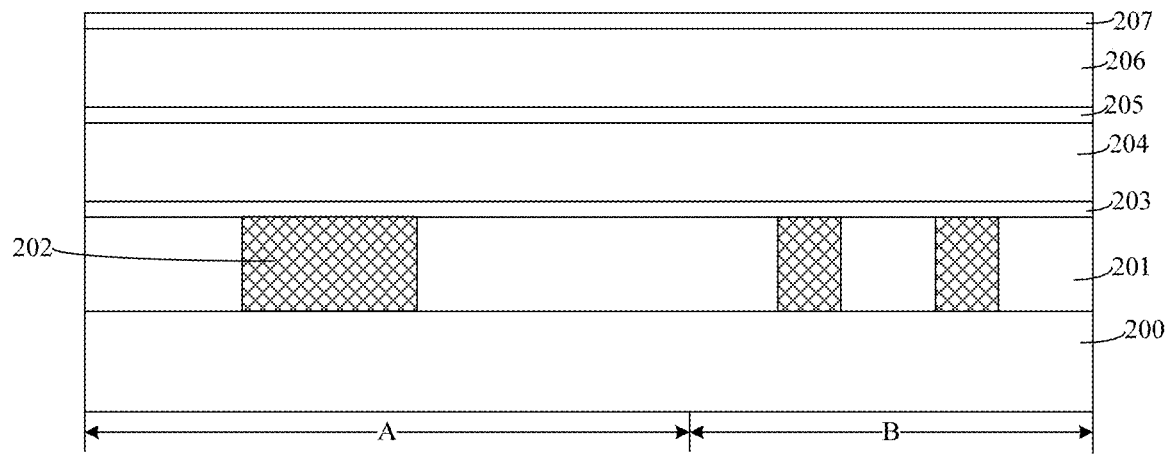

Returning to FIG. 13, after providing the semiconductor substrate with the first interconnect structure, a dielectric structure may be formed over the semiconductor substrate (S102). FIG. 4 illustrates a corresponding semiconductor structure.

As shown in FIG. 4, a dielectric structure may be formed over the semiconductor substrate. In particular, the dielectric structure may be formed on the interconnect stop layer 203. In one embodiment, the dielectric structure may include a first dielectric layer 204 on the surfaces of the interlayer dielectric layer 201 and the first interconnect structure 202, a first stop layer 205 on the surface of the first dielectric layer 204; and a second dielectric layer 206 on the surface of the first stop layer 205.

The first dielectric layer 204 may be made of any appropriate material. In one embodiment, the first dielectric layer 204 is made of silicon oxide. Various processes may be used to form the first dielectric layer 204, such as a CVD process or a PVD process, etc.

The first stop layer 205 may be made of any appropriate material. In one embodiment, the first stop layer 205 is made of silicon nitride. Various processes may be used to form the first stop layer 205, such as a CVD process, or a PVD process, etc.

The second dielectric layer 206 may be made of any appropriate material. In one embodiment, the second dielectric layer 206 is made of silicon oxide. Various processes may be used to form the second dielectric layer 206, such as a CVD process or a PVD process, etc.

Further, referring to FIG. 4, a first mask layer 207 may be formed on the second dielectric layer 206. The first mask layer 207 may be made of any appropriate material, such as silicon oxide, or silicon nitride, etc.

The portion of the first mask layer 207 in the first region A may have a plurality of first mask openings (not shown). The portion of the first mask layer 207 in the second region B may include a plurality of second mask openings. The first mask openings in the first region A may define the sizes and positions of the subsequently formed first openings; and the second mask openings may define the sizes and positions of the subsequently formed second interconnect openings.

Figure 5:
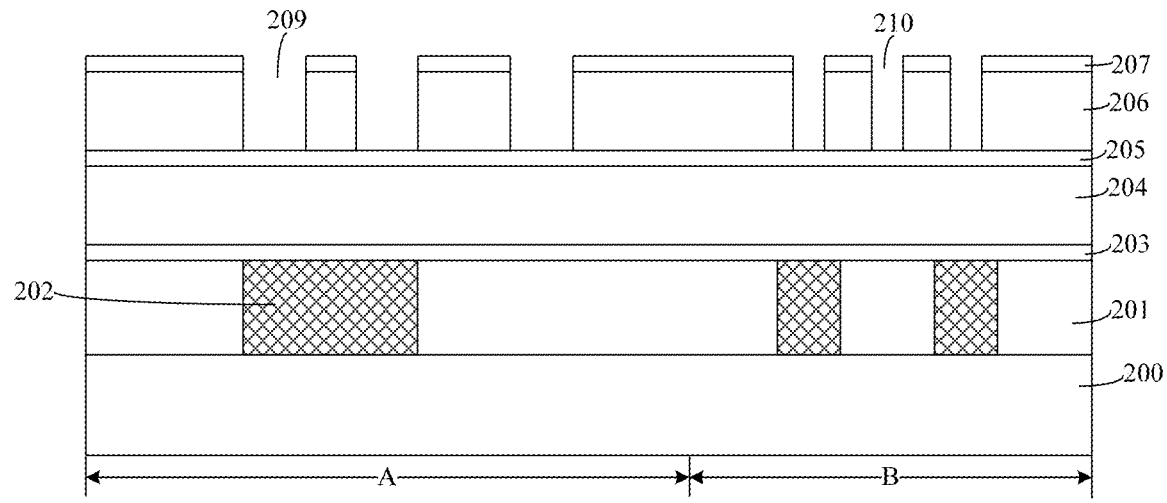

Returning to FIG. 13, after forming the dielectric structure, first openings and second interconnect openings may be formed in the dielectric structure (S103). FIG. 5 illustrates a corresponding semiconductor structure.

As shown in FIG. 5, a plurality of first openings 209 are formed in the dielectric structure in the first region A. In particular, the plurality of first openings 209 may be formed in the second dielectric layer 206 in the first region A. Further, a plurality of second interconnect openings 210 may be formed in the dielectric structure in the second region B. In particular, the plurality of second interconnect openings 210 may be formed in the second dielectric layer 206 in the second region B. The plurality of first openings 209 may be formed by etching the second dielectric layer 206 until the top surface of the first stop layer 205 is exposed using the portion of the first mask layer 207 in the first region A as an etching mask. The plurality of second interconnect openings 210 may be formed by etching the second dielectric layer 206 until the top surface of the first stop layer 205 is exposed using the portion of the first mask layer 207 in the second region B as an etching mask.

The process for etching the second dielectric layer 206 using the portion of the first mask layer 207 in the first region A as an etching mask may be a dry etching process, a wet etching process, or a combination of a dry etching process and a wet etching process, etc.

The process for etching the second dielectric layer 206 using the portion of the first mask layer 207 in the second region B as an etching mask may be a dry etching process, a wet etching process, or a combination of a dry etching process and a wet etching process, etc.

The size of the first openings 209 along a direction parallel to the surface of the semiconductor substrate 200 may be smaller than approximately 200 μm. When the size of the first openings 209 along the direction parallel to the surface of the semiconductor substrate 200 is greater than 200 μm, the amount of the first barrier material left inside the first openings 209 after a subsequent first planarization process may be substantially small. In particular, the amount of the subsequently formed first barrier members in the first openings 209 may be substantially small. Thus, the barrier performance of the first barrier members may not be as desired; and it may not facilitate to reduce the electromagnetic wave loss.

When the size of the second interconnect openings 210 along the direction parallel to the surface of the semiconductor substrate 200 is smaller than approximately 200 μm, the amount of the first barrier material left inside the second interconnect openings 210 after a subsequent planarization process may be substantially large. The first barrier material left inside the second interconnect openings 210 may be configured as a second interconnect structure.

Figure 6:
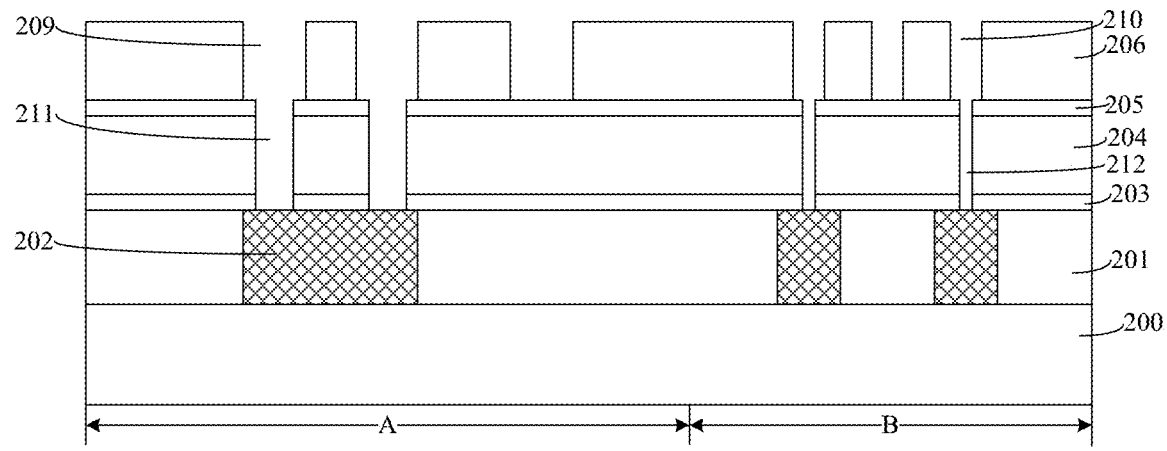

Returning to FIG. 13, after forming the first openings and the second interconnect openings, interconnect through holes may be formed (S104). FIG. 6 illustrates a corresponding semiconductor structure.

As shown in FIG. 6, interconnect through holes 212 may be formed in the interconnect stop layer 203, the first dielectric layer 204 and the first stop layer 205 under the bottoms of the second interconnect openings 210. The interconnect through holes 212 may be formed by removing portions of the interconnect stop layer 203, the first dielectric layer 204 and the first stop layer 205 under the bottoms of the second interconnect openings 210. One interconnect through hole 212 may be formed under the bottom of one second interconnect opening 210. Some interconnect through holes 212 may not be shown in the cross-sectional view in FIG. 6.

The portions of the interconnect top layer 203, the first dielectric layer 204 and the first stop layer 205 under the bottom of the second interconnect openings 210 may be removed by any appropriate process, such as a dry etching process, a wet etching process, or a combination of a dry etching process and a wet etching process, etc.

The bottom of the interconnect through holes 212 may expose the top surface of the first interconnect structure 202 (not shown in FIG. 6) so as to allow a second interconnect structure subsequently formed in the second interconnect openings 210 and the interconnect through holes 212 to electrically connect with the first interconnect structure 202.

In one embodiment, during the process for forming the interconnect through holes 212, the portions of the interconnect stop layer 203, the first dielectric layer 204 and the first stop layer 205 under the bottoms of the first openings 209 may also be removed; and first through holes 211 may be formed in the interconnect top layer 203, the first dielectric layer 204 and the first stop layer 205 under the bottoms of the first openings 209. In some embodiments, the formation of the first through holes may be optional. In particular, the portions of the interconnect stop layer, the first dielectric layer and the first stop layer under the bottoms of the first openings may not be removed.

The projection of the first through hole 211 on the surface of the semiconductor substrate 200 may be within a projection of the first opening 209 on the surface of the semiconductor substrate 200. The projection of the interconnect through hole 212 on the surface of the semiconductor substrate 200 may be within a projection of the second interconnect opening 210 on the surface of the semiconductor substrate 200.

Figure 7:
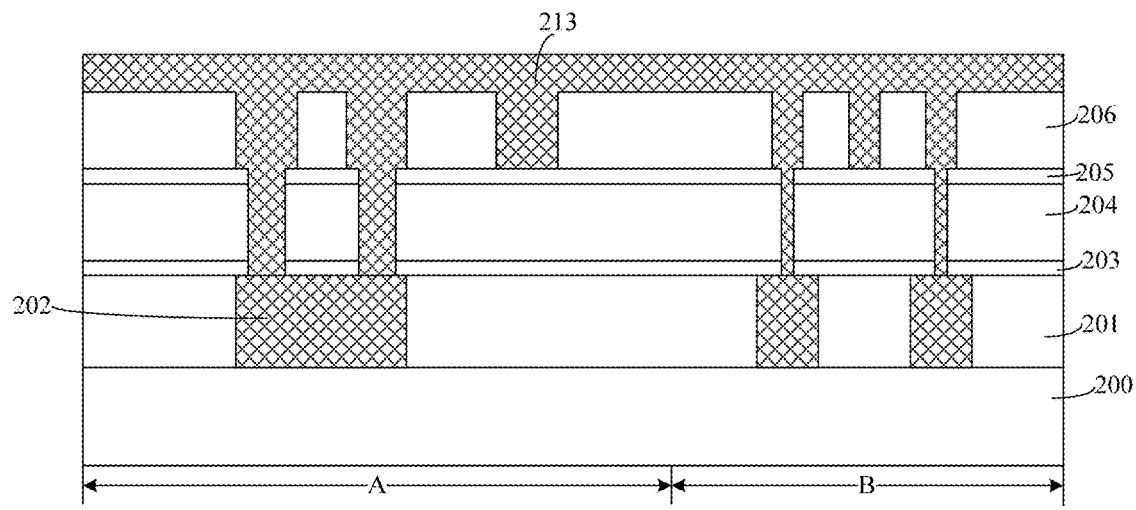

Returning to FIG. 13, after forming the first through holes and the interconnect through holes, a first barrier material layer may be formed (S105). FIG. 7 illustrates a corresponding semiconductor structure.

As shown in FIG. 7, a first barrier material layer 213 may be formed in the first openings 209 (referring to FIG. 6), the second interconnect openings 210 (referring to FIG. 6), the interconnect through holes 212 (referring to FIG. 6) and the first through holes 211 (referring to FIG. 6), and on the surface of the second dielectric layer 206.

The first barrier material layer 213 may be made of any appropriate material, such as a metal material, etc. In one embodiment, the first barrier material layer 213 is made of Copper (Cu). In some embodiments, the first barrier material layer may be made of aluminum (Al)

The portions of the first barrier material layer 213 in the first openings 209 may be used to subsequently form first barrier members. The portions of the first barrier material layer 213 in the second interconnect openings 210 and the interconnect through holes 212 may be used to subsequently form a second interconnect structure.

Figure 8:
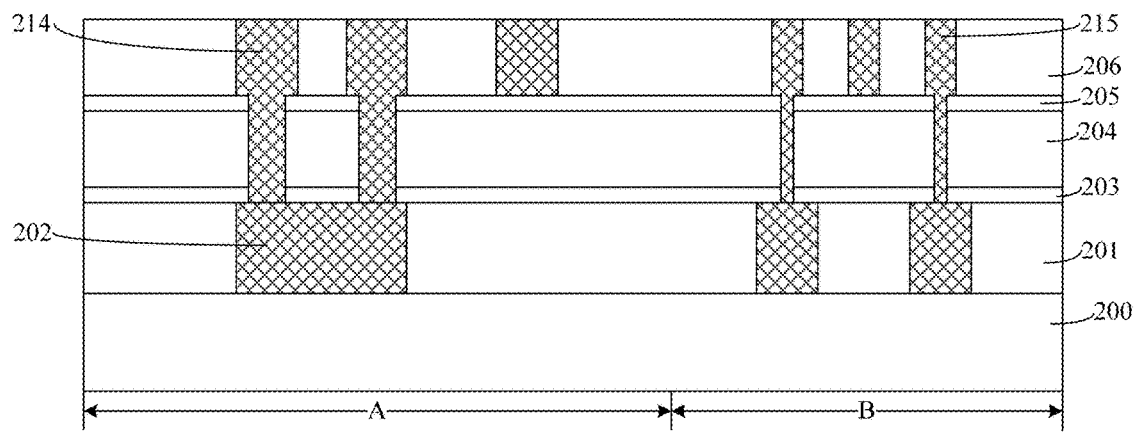

Returning to FIG. 13, after forming the first barrier material layer, first barrier members may be formed (S106). FIG. 8 illustrates a corresponding semiconductor structure.

As shown in FIG. 8, first barrier members 214 may be formed in the first openings 209 (referring to FIG. 6). In particular, one first barrier member 214 may be formed in each of the first openings 209. Further, a second interconnect structure 215 may be formed in the second interconnect openings 210 and the interconnect through holes 212. The process for forming the first barrier members 214 and the second interconnect structure 215 may include performing a planarization process on the first barrier material layer 213 until the top surface of the second dielectric layer 206 is exposed.

The planarization process may be any appropriate process. In one embodiment, the planarization process is a chemical mechanical polishing (CMP) process.

The CMP apparatus may include a polishing pad. Although the polishing pad may deform during the CMP process, the polishing pad may be unable to polish the portions of the first polishing material layer 213 in the first openings 209 during the CMP process because the size of the first openings 209 along the direction parallel to the surface of the semiconductor substrate 200 may be substantially small. Thus, the amount of the first barrier members 214 formed in the first openings 209 may be substantially large. Accordingly, the barrier performance of the first barrier members 214 may be sufficient; and it may facilitate to reduce the electromagnetic wave loss; and the performance of the semiconductor device may be improved.

Similarly, because the size of the second interconnect openings 210 along the direction parallel to the surface of the semiconductor substrate 200 may be substantially small, the amount of the first barrier material layer 213 in the second interconnect openings 210 polished by the CMP process may be substantially small. Thus, the performance of the second interconnect structure 215 formed in the second interconnect openings 210 and the interconnect through holes 212 may be as desired. Further, the second interconnect structure 215 may be electrically connected with the first interconnect structure 202; and it may facilitate to improve the performance of the semiconductor device.

Figure 9:
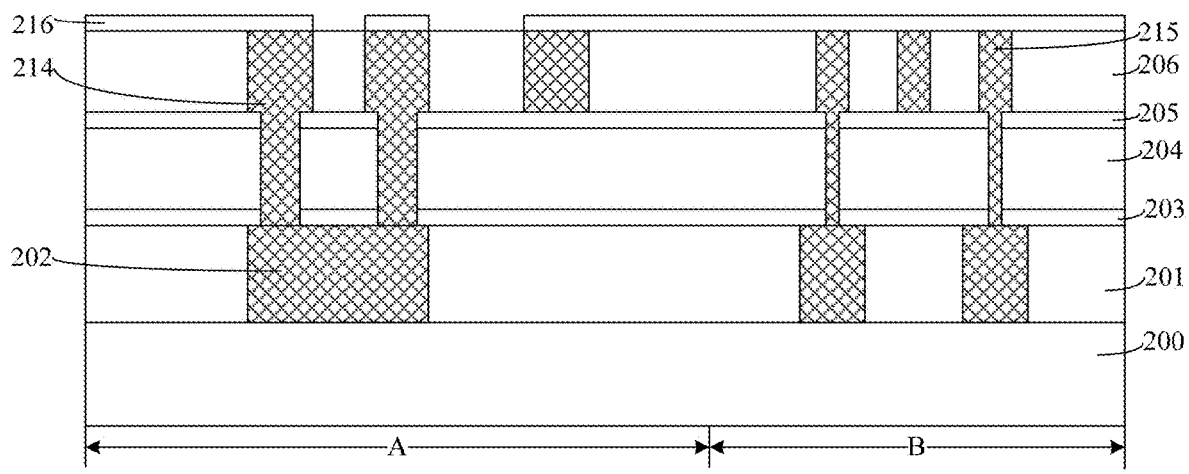

Returning to FIG. 13, after forming the first barrier members and the second interconnect structure, a second mask layer may be formed (S107). FIG. 9 illustrates a corresponding semiconductor structure.

As shown in FIG. 9, a second mask layer 216 may be formed on the surfaces of the second dielectric layer 206, the first barrier members 214 and the second interconnect structure 215. The second mask layer 216 may expose the portions of the top surface of the second dielectric layer 206 among adjacent first barrier members 214.

The second mask layer 216 may be used to subsequently form a second opening mask for forming second openings. The second mask layer 216 may be made of any appropriate material, such as silicon nitride, or silicon oxynitride, etc.

Figure 10:
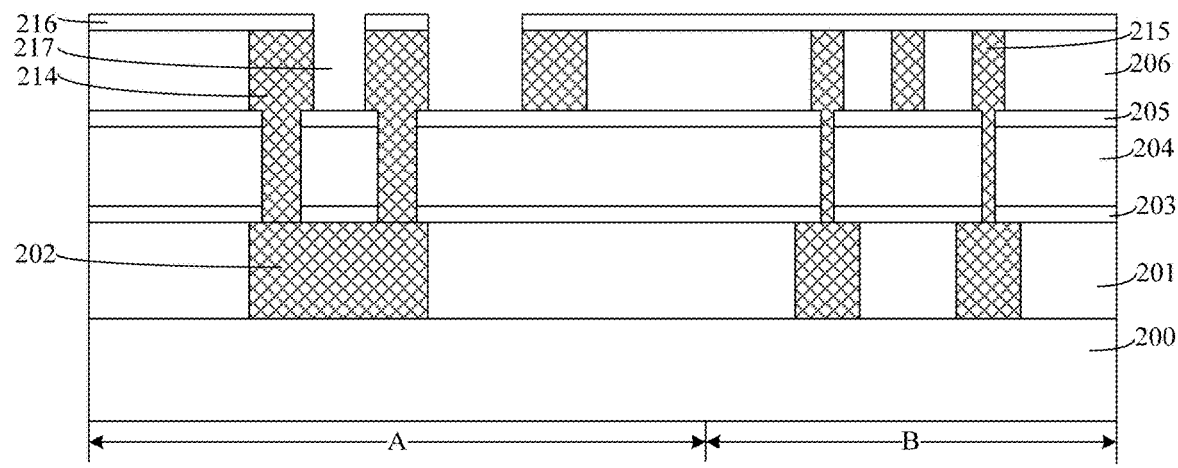

Returning to FIG. 13, after forming the second mask layer, second openings may be formed (S108). FIG. 10 illustrates a corresponding semiconductor structure.

As shown in FIG. 10, second openings 217 may be formed in the dielectric structure. In particular, the second openings 217 may be formed in the second dielectric layer 206. The second openings 217 may expose the sidewall surfaces of the first barrier members 214. The second openings 217 may be formed by etching the portions of the second dielectric layer 206 among the adjacent first barrier members 214 using the second mask layer 216 as an etching mask.

The process for etching the portions of the second dielectric layer 206 among the adjacent first barrier members 214 using the second mask layer 216 as an etching mask may be a dry etching process, a wet etching process, a combination of a dry etching process and a wet etching process, etc. In one embodiment, the process for removing the portions of the second dielectric layer 206 among the adjacent first barrier members 214 using the second mask layer 216 as an etching mask is a wet etching process. The etching solution of the wet etching process may be a diluted hydrogen fluoride solution.

The wet etching process may not only have a certain etching rate perpendicular to the surface of the semiconductor substrate 200, but also have a certain etching rate parallel to the surface of the semiconductor substrate 200. The wet etching process may etch the semiconductor substrate 200 along the direction parallel to the surface of the semiconductor substrate 200. Thus, the portions of the second dielectric layer 206 among the adjacent first barrier members 214 may be entirely removed to enable the second barrier members subsequently formed in the second openings 217 to contact with the first barrier members 214. The first barrier members 214 and the second barrier members may be together configured as a barrier structure to reduce the electromagnetic wave loss. Accordingly, the performance of the semiconductor structure may be improved.

In one embodiment, the size of the second opening 217 along the direction parallel to the surface of the semiconductor substrate 200 may be smaller than approximately 200 µm. If the size of the second opening 217 along the direction parallel to the surface of the semiconductor substrate 200 is greater than 200 µm, portions of the first barrier members 214 may also be removed during the wet etching process; and it may not facilitate to improve the performance of the first barrier members 214.

The sidewall surfaces of the second openings 217 may expose the sidewall surfaces of the first barrier members 214. Thus, the second barrier members subsequently formed in the second openings 217 may contact with the first barrier members 214. The first barrier members 214 and the second barrier members may together be configured as a barrier structure to reduce the electromagnetic wave loss. Accordingly, the performance of the semiconductor device may be improved.

During the process for forming the second openings 217, the second mask layer 216 on the first barrier members 214 may be able to protect the first barrier members 214; and the oxidation issue on the surfaces of the first barrier members 214 may be prevented. Accordingly, it may facilitate to improve the performance of the first barrier members 214.

Referring to FIG. 10, in one embodiment, after forming the second openings 217, the second mask layer 216 may be retained. In some embodiments, the second mask layer 216 may be removed after forming the second openings.

Returning to FIG. 13, after forming the second openings, a second barrier material layer may be formed (S109). FIG. 11 illustrates a corresponding semiconductor structure.

As shown in FIG. 11, a second barrier material layer 218 may be formed in the second openings 217 (referring to FIG. 10) and over the surfaces of the first barrier members 214 and the second interconnect structure 215. The portions of the second barrier material layer 218 in the second openings 217 may be used to subsequently form second barrier members.

In one embodiment, the second mask layer 216 may be retained after forming the second openings 217. Accordingly, the second barrier material layer 218 may also be formed on the surface of the second barrier material layer 218.

The second barrier material layer 218 may be made of any appropriate material, such as a metal material, etc. In one embodiment, the second barrier material layer 218 is made of Cu. In some embodiments, the second barrier material layer may be made of Al.

Various processes may be used to form the second barrier material layer 218, such as a CVD process or a PVD process, etc.

Returning to FIG. 13, after forming the second barrier material layer, second barrier members may be formed (S110). FIG. 12 illustrates a corresponding semiconductor structure.

As shown in FIG. 12, second barrier members 219 may be formed in the second openings 217 (referring to FIG. 11). In particular, one second barrier member 219 may be formed in each of the second openings 217. The second barrier members 219 may be formed by planarizing the second barrier material layer 218 until the top surface of the second dielectric layer 206 is exposed.

The second barrier material layer 218 may be planarized by any appropriate processes. In one embodiment, a CMP process is used to planarize the second barrier material layer 218.

The apparatus of the CMP process may include a polishing pad. Although the polishing pad may deform during the CMP process, the polishing pad may be unable to polish the portions of the second barrier material layer 218 in the second openings 217 during the CMP process because the size of the second openings 217 along the direction parallel to the surface of the semiconductor substrate 200 may be substantially small. Thus, the amount of the second barrier members 219 formed in the second openings 217 may be substantially large. Accordingly, the ability of the second barrier members 219 for reducing the electromagnetic wave loss may be sufficient; and the performance of the semiconductor device may be improved.

Referring to FIG. 12, during the process for planarizing the second barrier material layer 218, the second mask layer 216 may be removed.

The present disclosure also provides a semiconductor structure. FIG. 12 illustrates a corresponding semiconductor structure.

As shown in FIG. 12, the semiconductor structure may include a semiconductor substrate 200 having a first region A and a second region B. The semiconductor structure may also include a dielectric structure on the semiconductor substrate 200. The dielectric structure may include a first dielectric layer 204 over the semiconductor substrate 200, a first stop layer 205 on the first dielectric layer 204 and a second dielectric layer 206 on the first stop layer 205. The semiconductor structure may also include an interlayer dielectric layer on the semiconductor substrate 200 and a first interconnect structure 202 formed in the interlayer dielectric layer 201 and on the first region A of the semiconductor substrate 200. Further, the semiconductor structure may include an interconnect stop layer 203 over the interconnect dielectric layer 201. Further, the semiconductor structure may include a plurality of first barrier members 214 in the dielectric structure and second barrier members 219 with the sidewall surfaces contacting with sidewall surfaces of the first barrier members 214 in the dielectric structure. Further, the semiconductor structure may include a second interconnect structure 215 in the dielectric structure in the second region B. The detailed structures and intermediate structures are described above with respect to the fabrication processes.

Referring to FIG. 6, the first barrier members 209 may be formed in the plurality of first openings 209 in the dielectric structure.

Referring to FIG. 10, the second barrier members 209 may be formed in the second openings 217 in the dielectric structure. The second openings 217 may be formed among the adjacent first barrier members 214; and the sidewall surfaces of the second openings 217 may expose the sidewall surfaces of the first barrier members 214.

In the disclosed method for fabricating a semiconductor structure, the first barrier members and the second barrier members may together form a barrier structure. The barrier structure may reduce the electromagnetic wave loss in the RF circuit. The first openings may hold the first barrier members; and the second openings may hold the second barrier members. Thus, the size of the first openings may be smaller than the total size of the first barrier members and the second barrier members. During the process for forming the first barrier members, the non-removed portions of the dielectric structure in the first region may be able to provide sufficient support such that the planarization process for forming the first barrier members may not cause the first barrier members to have concaved shapes. Similarly, the size of the second openings may be smaller than the total size of the first barrier members and the second barrier members. During the process for forming the first barrier members, the first barrier members may be able to provide sufficient support such that the planarization process for forming the second barrier members may not cause the second barrier members to have concaved shapes. Because the thickness of the first barrier members and the thickness of the second barrier members may be both substantially large, the electromagnetic shielding ability of the barrier structure may be substantially large; and the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:

providing a semiconductor substrate having at least a first region;

forming a dielectric structure over the semiconductor substrate;

forming a plurality of first openings in the dielectric structure in the first region by removing portions of the dielectric structure in the first region;

forming a first barrier member in each of the plurality of first openings;

forming second openings with sidewall surfaces exposing sidewall surfaces of the first barrier members by entirely removing each portion of the dielectric structure between adjacent first openings; and forming a second barrier member in each of the second openings, each of the second barrier member being in direct contact with two adjacent first barrier members.

2. The method according to claim 1, wherein:

a size of the first opening along a direction parallel to a top surface of the semiconductor substrate is smaller than approximately 200 µm.

3. The method according to claim 1, wherein:

a size of the second opening along a direction parallel to a top surface of the semiconductor substrate is smaller than approximately 200 µm.

4. The method according to claim 1, wherein forming the first barrier members in the first openings comprises:

forming a first barrier material layer in the first openings and on a top surface of the dielectric structure; and planarizing the first barrier material layer until a top surface of the dielectric structure is exposed.

5. The method according to claim 4, wherein:

the first barrier material layer is planarized by a chemical mechanical polishing process.

6. The method according to claim 1, wherein forming the second barrier members in the second openings comprises:

forming a second barrier material layer in the second openings and on a top surface of the dielectric structure and on top surfaces of the first barrier members; and planarizing the second barrier material layer until the top surface of the dielectric structure is exposed.

7. The method according to claim 1, wherein:

the second barrier material layer is planarized by a chemical mechanical polishing process.

8. The method according to claim 1, wherein:

the dielectric structure includes a first dielectric layer formed over the semiconductor substrate, a first stop layer formed on the first dielectric layer, and a second dielectric layer formed on the first stop layer.

9. The method according to claim 8, wherein forming the plurality of first openings in the dielectric structure comprises:

forming a first mask layer having a plurality of first mask openings in the first region on a top surface of the second dielectric layer; and etching the second dielectric layer until a top surface of the first stop layer is exposed using the first mask layer as an etching mask.

10. The method according to claim 8, wherein forming the second openings comprises:

forming a second mask layer exposing top surfaces of the portions of the dielectric structure among the two adjacent first barrier members on the top surface of the second dielectric layer and top surfaces of the first barrier members; and etching the second dielectric layer until the top surface of the first stop layer is exposed using the second mask layer as an etching mask.

11. A method for fabricating a semiconductor structure, comprising:

providing a semiconductor substrate having at least a first region;

forming a dielectric structure over the semiconductor substrate, wherein the dielectric structure includes a first dielectric layer formed over the semiconductor substrate, a first stop layer formed on the first dielectric layer, and a second dielectric layer formed on the first stop layer;

forming a plurality of first openings in the dielectric structure in the first region by removing portions of the dielectric structure in the first region, wherein forming the plurality of first openings in the dielectric structure comprises:

forming a first mask layer having a plurality of first mask openings in the first region on a top surface of the second dielectric layer; and etching the second dielectric layer until a top surface of the first stop layer is exposed using the first mask layer as an etching mask;

forming a first barrier member in each of the plurality of first openings;

forming second openings with sidewall surfaces exposing sidewall surfaces of the first barrier members by removing portions of the dielectric structure between adjacent first openings, wherein the semiconductor substrate further includes a second region and the first mask layer in the second region also includes a plurality of second mask openings, further comprising:

forming second interconnect openings in the second dielectric layer in the second region by etching the second dielectric layer using the first mask layer in the second region as an etching mask, wherein a size of the interconnect opening along the direction parallel to the surface of the semiconductor substrate is smaller than approximately 200 µm; and forming a second barrier member in each of the second openings.

12. The method according to claim 11, after forming the first openings and the second interconnect openings and before forming the second openings, further comprising:

removing portions of the first dielectric layer under bottoms of the first openings to form first through holes in the first dielectric layer under the bottoms of the first openings;

removing portions of the first dielectric layer under bottoms of the second openings to form interconnect through holes in the first dielectric layer under the bottoms of the second interconnect openings, wherein:
- a projection of the first through hole on the surface of the semiconductor substrate is within a projection of the first opening on the surface of the semiconductor substrate; and
- a projection of the interconnect through hole on the surface of the semiconductor substrate is within a projection of the second interconnect opening on the surface of the semiconductor substrate.

13. The method according to claim 1, wherein:
the first barrier members are made of a metal material; and
the second barrier members are made of a metal material.

14. The method according to claim 11, wherein:
a size of the first opening along a direction parallel to a top surface of the semiconductor substrate is smaller than approximately 200 μm.

15. The method according to claim 11, wherein:
a size of the second opening along a direction parallel to a top surface of the semiconductor substrate is smaller than approximately 200 μm.

16. The method according to claim 11, wherein forming the first barrier members in the first openings comprises:
forming a first barrier material layer in the first openings and on a top surface of the dielectric structure; and
planarizing the first barrier material layer until a top surface of the dielectric structure is exposed.

17. The method according to claim 16, wherein:
the first barrier material layer is planarized by a chemical mechanical polishing process.

18. The method according to claim 11, wherein forming the second barrier members in the second openings comprises:
forming a second barrier material layer in the second openings and on a top surface of the dielectric structure and on top surfaces of the first barrier members; and
planarizing the second barrier material layer until the top surface of the dielectric structure is exposed.

19. The method according to claim 11, wherein:
the second barrier material layer is planarized by a chemical mechanical polishing process.

20. The method according to claim 11, wherein forming the second openings comprises:
forming a second mask layer exposing top surfaces of the portions of the dielectric structure among adjacent first barrier members on the top surface of the second dielectric layer and top surfaces of the first barrier members; and
etching the second dielectric layer until the top surface of the first stop layer is exposed using the second mask layer as an etching mask.

* * * * *